(12) United States Patent
Chen

(10) Patent No.: US 8,531,006 B2
(45) Date of Patent: Sep. 10, 2013

(54) MEMORY CAPACITOR MADE FROM FIELD CONFIGURABLE ION-DOPED MATERIALS

(75) Inventor: Yong Chen, Sherman Oaks, CA (US)

(73) Assignee: The Regents of the University of California, Oakland, CA (US)

( * ) Notice: Subject to any disclaimer, the term of this patent is extended or adjusted under 35 U.S.C. 154(b) by 300 days.

(21) Appl. No.: 12/941,005

(22) Filed: Nov. 5, 2010

(65) Prior Publication Data

US 2011/0108952 A1      May 12, 2011

Related U.S. Application Data

(60) Provisional application No. 61/258,261, filed on Nov. 5, 2009.

(51) Int. Cl.
    *H01L 29/93* (2006.01)
(52) U.S. Cl.
    USPC ............. 257/595; 257/E29.344; 365/149
(58) Field of Classification Search
    USPC ........... 257/296, 324, 325, 306, 307, 312, 257/532, 595, E27.049, E29.344; 365/149
    See application file for complete search history.

(56) References Cited

U.S. PATENT DOCUMENTS

2003/0096473 A1* 5/2003 Shih et al. ............ 438/240
2007/0252193 A1* 11/2007 Cho et al. ............ 257/315

* cited by examiner

*Primary Examiner* — Bilkis Jahan
(74) *Attorney, Agent, or Firm* — John P. O'Banion

(57) ABSTRACT

A memory capacitor based on a field configurable ion-doped polymer is reported. The device can be dynamically and reversibly programmed to analog capacitances with low-voltage (<5 V) pulses. After the device is programmed to a specific value, its capacitance remains nonvolatile. The field configurable capacitance is attributed to the modification of ionic dopant concentrations in the polymer. The ion and dipole concentrations in the ion conductive layer can be modified when the voltage biases applied to the electrodes exceeds a threshold value and can operate as a conventional capacitor when a voltage less than the threshold value is applied. The ion conductive layer will remain at a stable value after the device is modified without applying external voltage. The device has a nonvolatile memory function even when the external voltage is turned off. The memory capacitors may be used for analog memory, nonlinear analog and neuromorphic circuits.

11 Claims, 7 Drawing Sheets

MEMORY CAPACITOR MADE FROM FIELD CONFIGURABLE ION-DOPED MATERIALS

CROSS-REFERENCE TO RELATED APPLICATIONS

This application claims priority from U.S. provisional patent application Ser. No. 61/258,261 filed on Nov. 5, 2009 and incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to charge storage devices, and more particularly to a field configurable ion-doped capacitor.

2. Description of Related Art

The rapidly growing markets for hand held computers, mobile communications and wireless networking have created a demand for small sized, low energy consuming, high-performance circuits. Circuit elements such as capacitors are well known and understood in circuit design and are essential design elements.

A capacitor is considered to be a "passive" circuit element because it does not actively affect the electrical current. The typical capacitor consists of two isolated conductive plates separated by a dielectric with a charge +Q on one conductive plate an equal but opposite charge −Q stored on the other plate. Common dielectric materials include paper, plastic, glass and ceramics. The dielectric essentially insulates the plates and limits any transfer of charge between the plates. The capacitance of a given set of conductor plates depends only upon their geometry (i.e. the shape of the plates and the distance between the plates) and on the nature of the dielectric placed between the plates. The charge that is "stored" in the capacitor has been shown to be proportional to the potential difference between the two conductors.

The basic configuration of conventional capacitors and their capabilities have remained the same for many years. Recent attempts to expand or improve the capabilities of capacitors have met with limited success. For example, nonvolatile capacitors have been made from ferroelectric materials, but their capacitances can only be switched between bistable digital "0" and "1" states. The capacitances of reverse-biased semiconductor diodes or the gate capacitances of MOSFET's (varactors) can be modified by the voltage V, but the capacitance modification is volatile and cannot be memorized after the voltage is removed.

Accordingly, there is a need for a capacitor that can be small in size, has low energy consumption and has a capacitance that can be selectively modified. The present invention satisfies this need, as well as others, and generally overcomes the deficiencies of the prior art.

BRIEF SUMMARY OF THE INVENTION

The present invention generally comprises capacitor with a field configurable ion-doped material sandwiched between two metal electrodes. When a voltage bias is applied between the two electrodes, the ions can be injected into or extracted out from the polymer to modify the concentration of ionic dipoles in the materials, resulting in the modification of the polymer permittivity and device capacitance. The device may have a conventional source-channel-drain structure of a conventional metal-oxide-semiconductor (MOS) transistor. An insulating layer may optionally be used to cover one or two of the electrodes.

The capacitor according to the invention is preferably based on a field-configurable ion-doped polymer where the modification of ionic concentrations can induce a nonvolatile change the dielectric properties of the polymer. The memory capacitor can be reversibly programmed to analog capacitance values by applying selected voltage pulses. The memory capacitor has the potential to be a device where not only is the charge stored in the device but its capacitance can also be modified as a function of voltage applied to the device.

According to one aspect of the invention, a capacitor with a memory is provided where the ion and dipole concentrations in the ion-doped layer can be modified to an arbitrary analog value. This analog configuration function enables the device to have a "learning" capability while processing the signals.

According to another aspect of the invention, a memory capacitor is provided where the ion and dipole concentrations in the ion conductive layer can be modified when the voltage biases applied on the electrodes exceeds a threshold value. Therefore the memory capacitor can be operated as a conventional capacitor when a voltage that is applied is less than the threshold value.

Another aspect of the invention is to provide a memory capacitor where the ion and dipole concentrations in the ion conductive layer will remain at a stable value after the device is modified without applying external voltage. The device therefore has a nonvolatile memory function even when the external voltage is turned off.

One of the advantages of the memory capacitor is that the device consumes very low amounts of energy when it is configured and processes signals, and consumes no energy for memory.

Another aspect of the memory capacitor is that the device can be fabricated based on nanoscale Si-based semiconductor circuits. The size of the device can be extremely small.

A further aspect of the invention is to provide a memory capacitor that is small-sized and has low-energy-consumption that can be used for field programmable filters; field programmable couplers/decouplers; and field programmable resonators.

A further aspect of the invention is to provide a small-sized, low-energy-consumption device that can be used in field programmable analog circuits; field programmable nonlinear circuits; field programmable signal processing circuits; field programmable automatic control circuits and neuromorphic circuits with memory, learning, and signal processing capabilities.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus and methods generally illustrated in FIG. 1 through FIG. 7. It will be appreciated that the apparatus may vary as to configuration and as to details of the parts, and that the methods may vary as to the specific steps and sequence, without departing from the basic concepts as disclosed herein.

Figure 1:
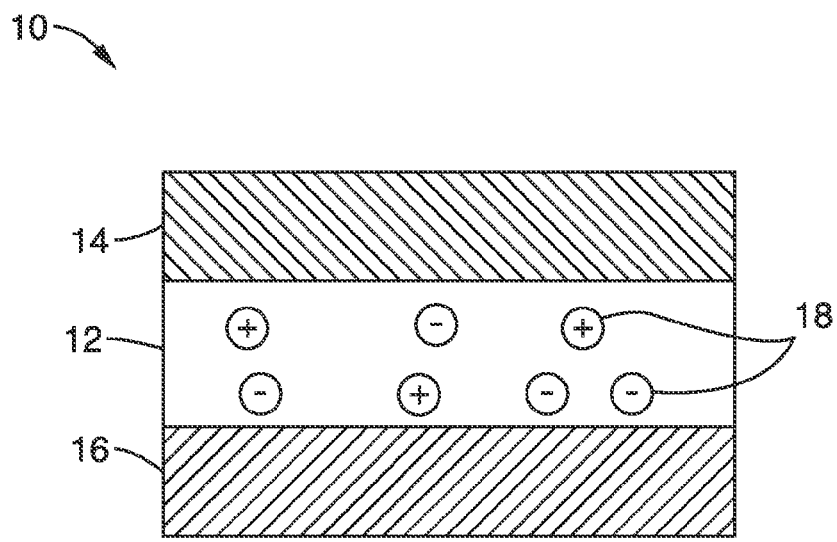
FIG. 1 is a schematic cross-sectional diagram of a capacitor structure embodiment with an ion doped layer sandwiched between a pair of metal electrodes according to one embodiment of the invention.

Turning now to the schematic representation of one embodiment of a capacitor 10 with a memory shown in FIG. 1, it can be seen that the general structure of the device is a field configurable ion-doped material 12 sandwiched between two electrodes 14, 16. When a voltage bias is applied to the two electrodes 14, 16, ions 18 can be injected into or extracted out from the material 12 to modify the concentration of ionic dipoles, resulting in the modification of permittivity and capacitance.

The metal electrodes 14, 16 in the memory capacitor 10 can be conductive metals and/or semiconductors. The ion-doped materials 12 can be polymers, especially conjugated polymers or ion-conductive polymers such as MEH-PPV, nafion, and PSS-PEDOT. The ion-doped materials 12 can be solid state ion-doped materials or electrolyte (such as RbAg$_4$I$_5$, ZrO$_2$, lanthanum fluoride, silver sulfide, perovskite or ceramics). The ion injected into the ion-doped materials 12 can form ionic dipoles, and the modification of ionic dipoles in the ion-doped materials can cause the change of permittivity of the materials and device capacitance. The ion-doped materials 12 can also have multiple layer structures in order to enhance the device performance such as its switching voltage, switching speed, memory stability, etc.

An insulating layer such as SiO$_2$ or Si$_3$N$_4$ can be added to on the top of one or two of the electrodes 14, 16 to avoid the leakage current in the device and increase the device capacitance. Voltage biases applied between or across the two electrodes can modify concentrations or distributions of ions and ionic dipoles 18 in the ion-doped materials, resulting in the modification of the permittivity of the material and the device capacitance.

Figure 2:
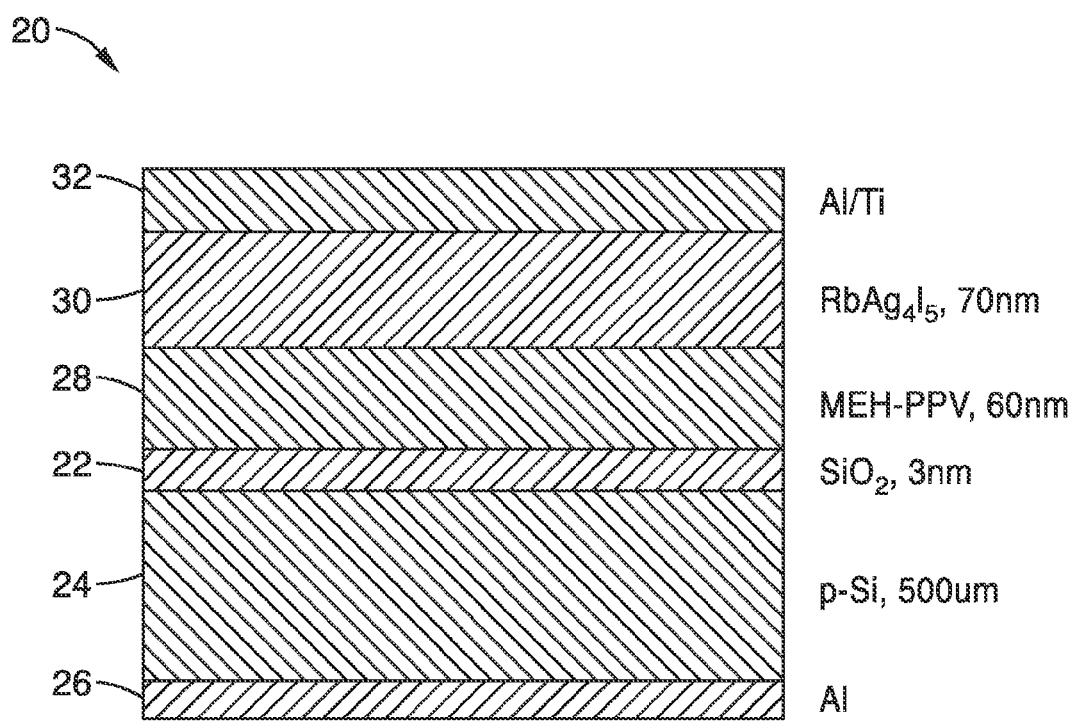
FIG. 2 is a schematic cross-sectional diagram of an Al/Ti/RbAg$_4$I$_5$/MEH-PPV/SiO$_2$/p-Si/Al memory capacitor structure according to another embodiment of the present invention.

In one preferred embodiment shown in FIG. 2, a memory capacitor structure 20 is provided comprising an Al/Ti/RbAg$_4$I$_5$/MEH-PPV/SiO$_2$/p-Si/Al multilayer structure having an SiO$_2$ insulating layer 22 on a p-type Si substrate 24 contacted with an Al bottom electrode 26, a conjugated polymer layer 28 of poly[2-methoxy-5-(2'-ethylhexyloxy)-p-phenylene vinylene] (MEH-PPV), and a RbAg$_4$I$_5$ ionic conductive layer 30 that are sandwiched between the SiO$_2$ layer 22 and an Al/Ti top metal electrode 32.

In another embodiment, a memory capacitor structure is provided without the SiO$_2$ layer 22 comprising an Al bottom electrode 26; a p-type Si layer 24 over the Al bottom electrode 26; a conjugated polymer layer 28 of poly[2-methoxy-5-(2'-ethylhexyloxy)-p-phenylene vinylene] (MEH-PPV) over the p-type Si layer 24; an RbAg$_4$I$_5$ ionic conductive layer 30 over the MEH-PPV layer 28; and an Al/Ti top electrode 32 over the ionic conductive layer 30.

One of the advantages of the memory capacitor 10 is that the ion and dipole 18 concentrations in the ion-doped layer 12 can be modified to an arbitrary analog value. This analog configuration function provides the device with a "learning" capability while processing the signals. The ion and dipole concentrations in the ion conductive layer have been shown to remain at a stable value after the device is modified without applying an external voltage. The device has a nonvolatile memory function even when the external voltage is turned off. The ion and dipole concentrations in the ion conductive layer 12 can also be modified when the voltage biases applied to the electrodes 14, 16 exceeds a threshold value. Therefore the memory capacitor will operate as a conventional capacitor when a voltage is applied that is less than a threshold value. The memory capacitor is preferably a passive two-terminal device that establishes a functional relationship between the amount of electric charge passing through the device, Q, and the voltage, V, applied to the device. The device behaves like a capacitor, but it is also endowed with configurability, memory, and hysteretic dynamic characteristics. The electric charge Q passing through the device is a function of voltage V applied to the device, wherein the capacitance and a configurable parameter ρ can be modified and memorized to arbitrary analog values by the voltage V as a function of time t and the configurable parameter ρ denotes the state of the device according to:

$$C_m(\rho, V, t) = \frac{dQ}{dV} = \frac{I}{dV/dt} \text{ and } \frac{d\rho}{dt} = f(\rho, V, t)$$

where I is the current that passes through the device. The device is reduced to conventional capacitor when $$\frac{d\rho}{dt} = 0$$

then the device capacitance is a constant.

Accordingly, the device capacitance can be configured to arbitrary analog values repeatedly and reversibly when the configurable parameter ρ is modified by applying voltage biases across the capacitor. When large configurable voltages are applied to the device, the ions can be injected into or extracted out from the polymer to modify the concentration of ionic dipoles in the materials, resulting in the modification of the polymer permittivity and device capacitance. The device capacitance can also be modified to arbitrary analog values dynamically and reversibly by applying voltage pulses and the configuration rate and direction can be tuned by the amplitude and polarity of the voltage pulses. After the device is modified to a specific capacitance value, it remains at the nonvolatile value when the device is tested with a small voltage bias.

It will be seen that the memory capacitor can be adapted for use in memory and field programmable filters, coupler/decouplers, resonators, analog circuits, nonlinear circuits, signal processing, automatic control, and neuromorphic circuits.

The invention may be better understood with reference to the accompanying examples, which are intended for purposes of illustration only and should not be construed as in any sense limiting the scope of the present invention as defined in the claims appended hereto.

EXAMPLE 1

In order to demonstrate the functionality of the invention and the general principles behind the device, an illustrative memory capacitor with an Al/Ti/RbAg$_4$I$_5$/MEH-PPV/SiO$_2$/p-Si/Al multilayer structure shown in FIG. 2 was constructed. A 3 nm thick SiO$_2$ insulating layer was grown on a p-type Si substrate contacted with an Al bottom electrode. A 70 nm-thick conjugated polymer layer of poly[2-methoxy-5-(2'-ethylhexyloxy)-p-phenylene vinylene] (MEH-PPV) and a 70 nm-thick RbAg$_4$I$_5$ ionic conductive layer were sandwiched between the SiO$_2$ layer and an Al/Ti top metal electrode (FIG. 2). The lateral area of the capacitor was ~3 mm$^2$.

Figure 3A:
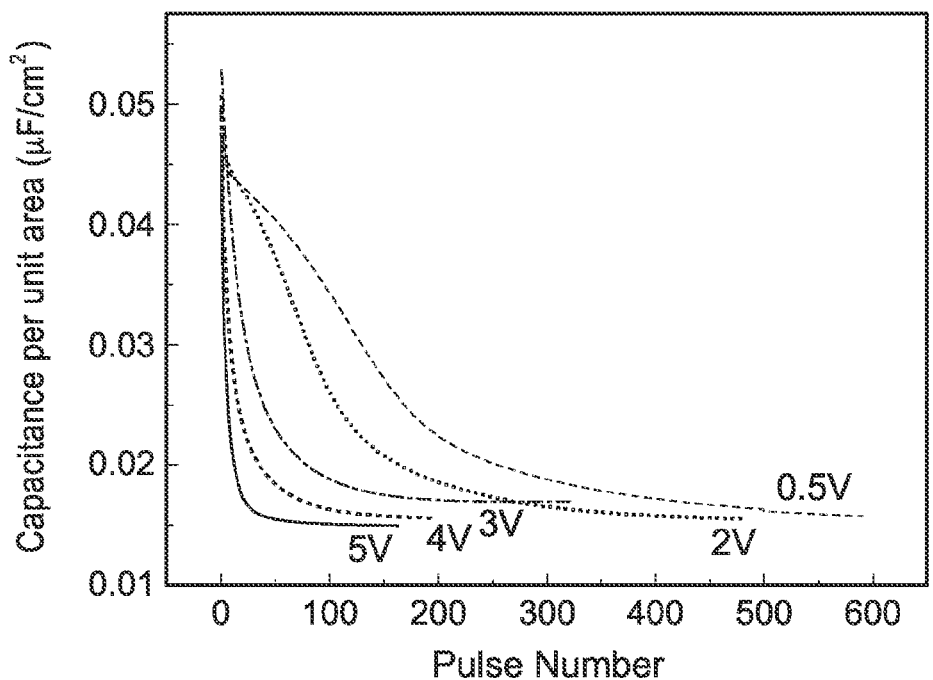
FIG. 3A is a graph of the change of the AC capacitance of a memory capacitor of FIG. 2 that is plotted as the function of the number of voltage pulses applied on the capacitor. The pulse amplitudes are fixed at 0.5 V, 2 V, 3 V, 5 V, and 6 V, respectively.

The functionality of the construct was then tested. The device capacitance was shown to be able to be modified to arbitrary "analog" values dynamically and reversibly by applying a series of voltage pulses with different amplitude and polarity. To demonstrate the analog modification, a constant DC voltage with an amplitude of $V_D$=−6 V was applied on the device to modify its capacitance to its largest saturation value (~0.05 μF/cm$^2$), consequently a series of positive voltage pulses with a fixed amplitude and a duration of 100 ms were applied on the device. After each pulse the device was stabilized at $V_D$=0 V for 100 ms, and then its AC differential capacitance was measured at $V_D$=0 V. As shown in FIG. 3A, the device AC capacitance was progressively decreased by the positive pulses. When the amplitudes of the pulses increased from 0.5 V to 6 V, the change rate of the capacitance increased.

Figure 3B:
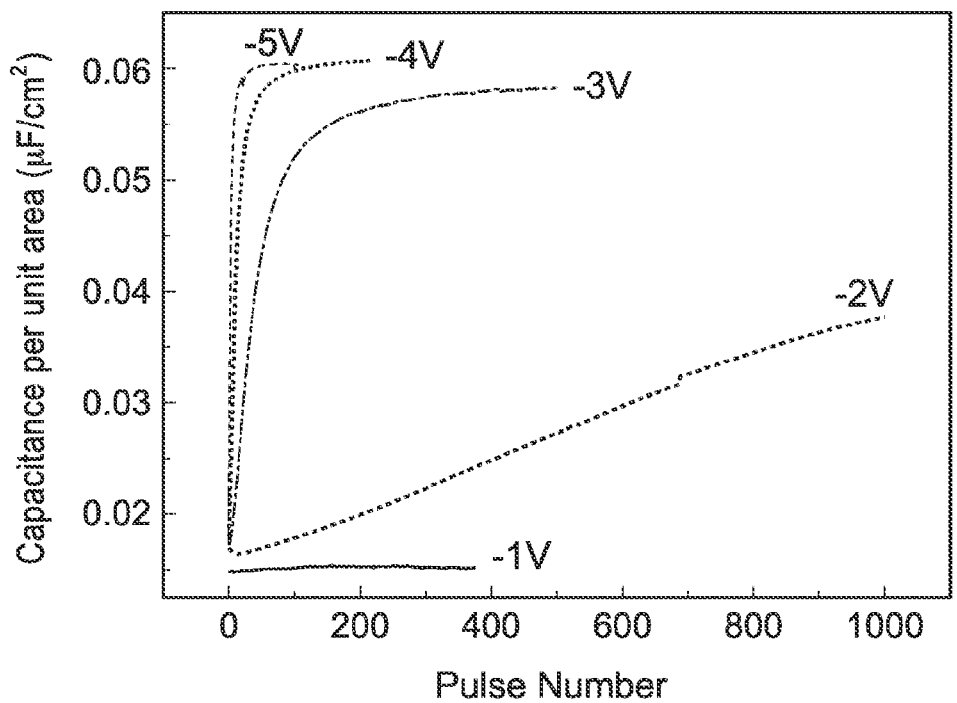
FIG. 3B is a graph of the change of the AC capacitance of a memory capacitor of FIG. 2 that is plotted as the function of the number of voltage pulses applied on the capacitor with the pulse amplitudes fixed at −1 V, −2 V, −3 V, −4 V, and −5 V, respectively.

The memory capacitor construct was also capable of being modified reversibly with negative pulses. Before the modification, a constant DC voltage with an amplitude of $V_D$=6 V was applied on the device to modify its capacitance to its smallest saturation value (~0.01 μF/cm$^2$), consequently a series of negative pulses with a fixed amplitude and a duration of 100 ms were applied on the memory capacitor. After each pulse the device was stabilized at $V_D$=0 V for 100 ms, and then its AC capacitance was measured at $V_D$=0 V. As shown in FIG. 3B, the AC capacitance was progressively increased by the negative pulses. When the amplitudes of the pulses changed from −1 V to −5 V, the change rate of the capacitance also increased.

Figure 4:
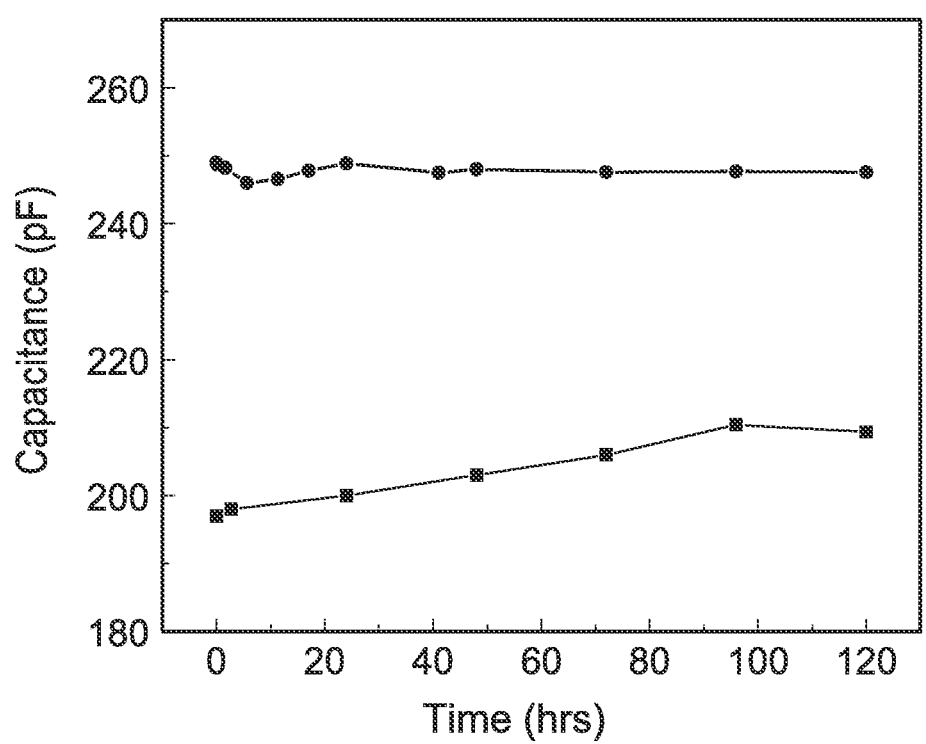
FIG. 4 is a graph of the configured capacitances of a memory capacitor of FIG. 2 plotted as a function of time in nonvolatile tests.

The nonvolatile properties of the memory capacitor device were tested by measuring the configured capacitances as the function of time. After the device capacitance was configured to certain value, the device could be tested with a voltage bias −0.96 V<$V_D$<0.41 V, and the device capacitances essentially remained at the same value unchanged with a long retention time. In the nonvolatile test, the memory capacitor was configured to a high capacitance value C=250 F/cm$^2$ by applying a DC voltage bias $V_D$=−3 V for 30 seconds, and then the device was tested at $V_D$=−0.7 V as the function of time for five days. As shown in FIG. 4, the capacitance value changed less than 1% within the five day test period.

The memory capacitor was also configured to a low capacitance value C=198 F/cm$^2$ by applying a DC voltage bias $V_D$=3 V for 30 seconds, and then the device was tested at $V_D$=0 V as the function of time for five days. As shown in FIG. 4, the capacitance value changed less than 5% within the five day period. The results indicated nonvolatile property of the memory capacitor was very good. The nonvolatile test time was limited by the availability of the test instruments, and retention times that are longer than five days are expected.

EXAMPLE 2

Figure 5A:
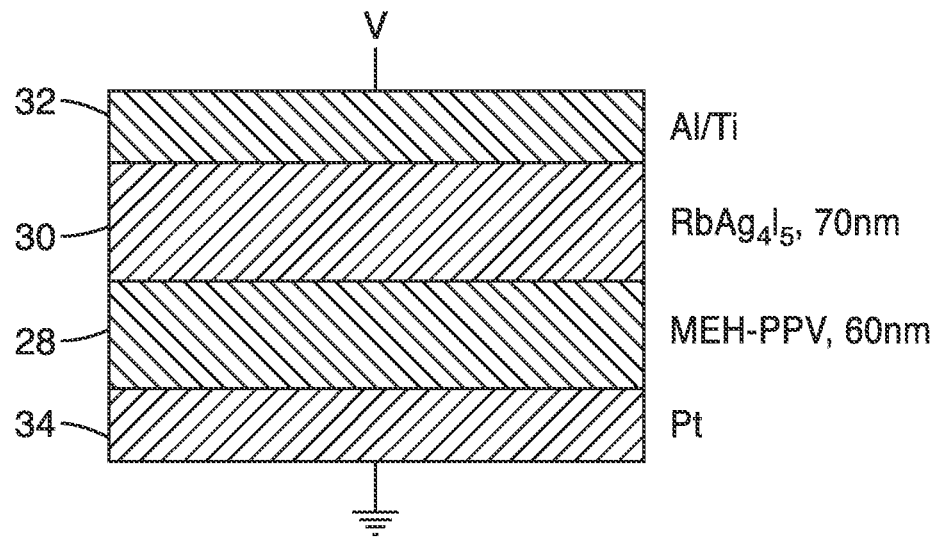
FIG. 5A is a memory capacitor embodiment according to the invention with an Al/Ti/RbAg$_4$I$_5$/MEH-PPV/Pt structure.
Figure 5B:
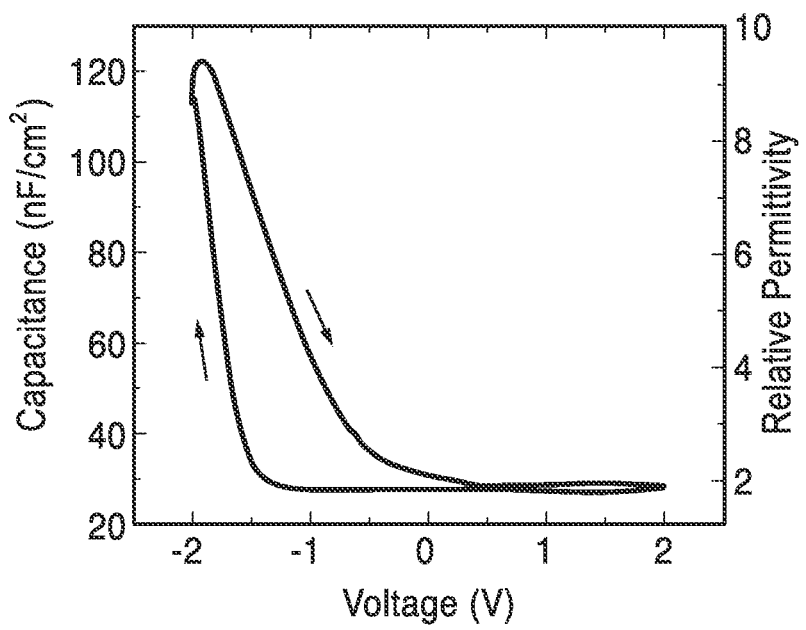
FIG. 5B is a graph of the device capacitances C as a function of the DC voltage V applied to a memory capacitor embodiment with an Al/Ti/RbAg$_4$I$_5$/MEH-PPV/Pt structure of FIG. 5A.
Figure 5C:
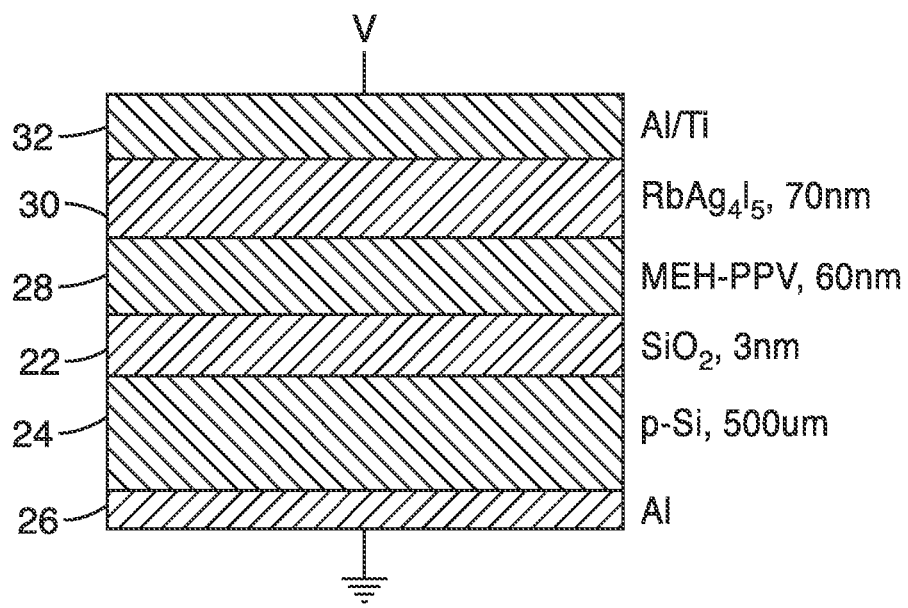
FIG. 5C is a memory capacitor embodiment according to the invention with an Al/Ti/RbAg$_4$I$_5$/MEH-PPV/SiO$_2$/p-Si/Al structure.

To further demonstrate the functionality of the invention, two field-configurable capacitor structures were constructed as shown in FIG. 5A and FIG. 5C for testing and comparison. The first structure integrated a layer of conjugated poly[2-methoxy-5-(2'-ethylhexyloxy)-p-phenylene vinylene] (MEH-PPV) polymer with a layer of RbAg$_4$I$_5$ ionic conductor in an Al/Ti/RbAg$_4$I$_5$/MEH-PPV/Pt multilayer structure (FIG. 5A). The 60 nm-thick MEH-PPV layer was spin-coated on the bottom Pt electrode 34, and the 70 nm-thick RbAg$_4$I$_5$ layer was deposited by thermal evaporation.

The differential capacitance, C, of the first structure was measured by applying an AC voltage with an amplitude of 25 mV and a frequency of 10 kHz under a DC voltage bias, V. The capacitance-voltage (C-V) measurements of the devices were carried out using an Agilent 4284 LCR meter with a DC voltage scan rate of ~5 mV/s and the bottom Pt electrode grounded. Since the RbAg$_4$I$_5$ layer has a high conductivity (>30 S/m), the polymer relative permittivity, $\in$, is therefore linearly proportional to the device capacitance, and can be derived directly. The C-V and $\in$-V curves are shown in the graph of FIG. 5B. The polymer relative permittivity increased continuously from 2.03 to 9.11 when V was swept from 0 V to −2 V, and then it decreased continuously from 9.11 to 2.09 when V was swept from −2 V to 0.5 V. The clockwise hysteresis loop of the $\in$-V curve reveals the modification of the polymer permittivity as a function of the voltage bias.

The second structure shown in FIG. 5C included the ion-doped polymer inserted in a metal-oxide-semiconductor (MOS) capacitor to form an Al/Ti/RbAg$_4$I$_5$/MEH-PPV/SiO$_2$/p-Si/Al multilayer structure. A 3 nm thick SiO$_2$ insulating layer was grown on a 500 μm-thick p-type Si substrate with a bottom Al electrode in this illustration. The SiO$_2$ layer can effectively block the leakage current through the MEH-PPV layer, and significantly improve the reliability and stability of the capacitor. Therefore, the properties of the memory capacitors were mainly studied based on this structure.

Figure 5D:
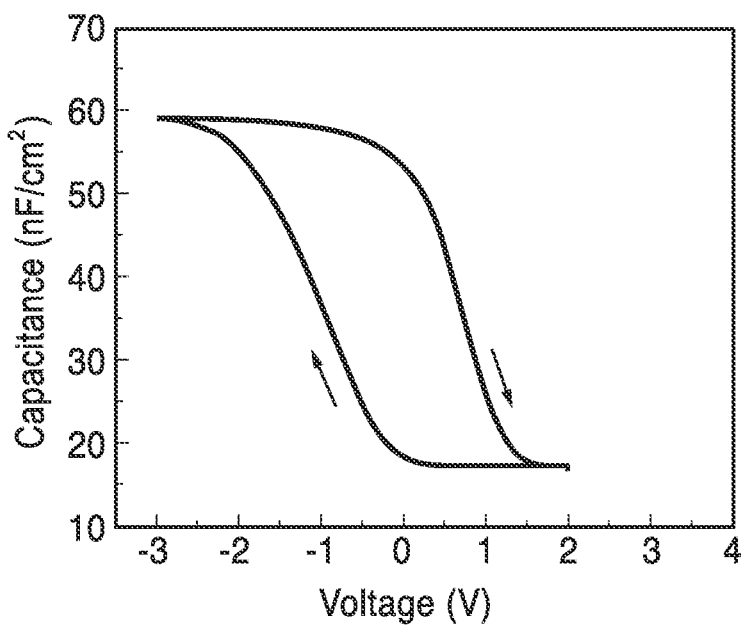
FIG. 5D is a graph of the device capacitances C as a function of the DC voltage V applied to a memory capacitor embodiment with an Al/Ti/RbAg$_4$I$_5$/MEH-PPV/SiO$_2$/p-Si/Al structure of FIG. 5C.

As shown in the graph of FIG. 5D, when V was swept from 2 V to −3 V, the device capacitance increased continuously and reached a saturation value. During the reverse sweep from −3 V to 2 V, the capacitance decreased continuously and returned to the original value. The clockwise hysteresis loop of the C-V curve with a voltage shift ΔV≈2 V was observed in the device.

The device capacitance could be configured dynamically and reversibly by applying a series of voltage pulses with different amplitudes and polarities, as demonstrated in a capacitor with the Al/Ti/RbAg$_4$I$_5$/MEH-PPV/SiO$_2$/p-Si/Al structure. A DC voltage V=+6 V was applied to set the initial capacitance state of the device to a low saturation value (~10 nF/cm$^2$). Subsequently, a series of 100 ms-wide negative voltage pulses with fixed amplitudes were applied to the device. After each pulse, the device was stabilized at V=0 V for 100 ms, and then its differential capacitance was measured at a zero DC voltage bias with a 25 mV AC voltage at a frequency of 10 kHz.

Figure 6A:
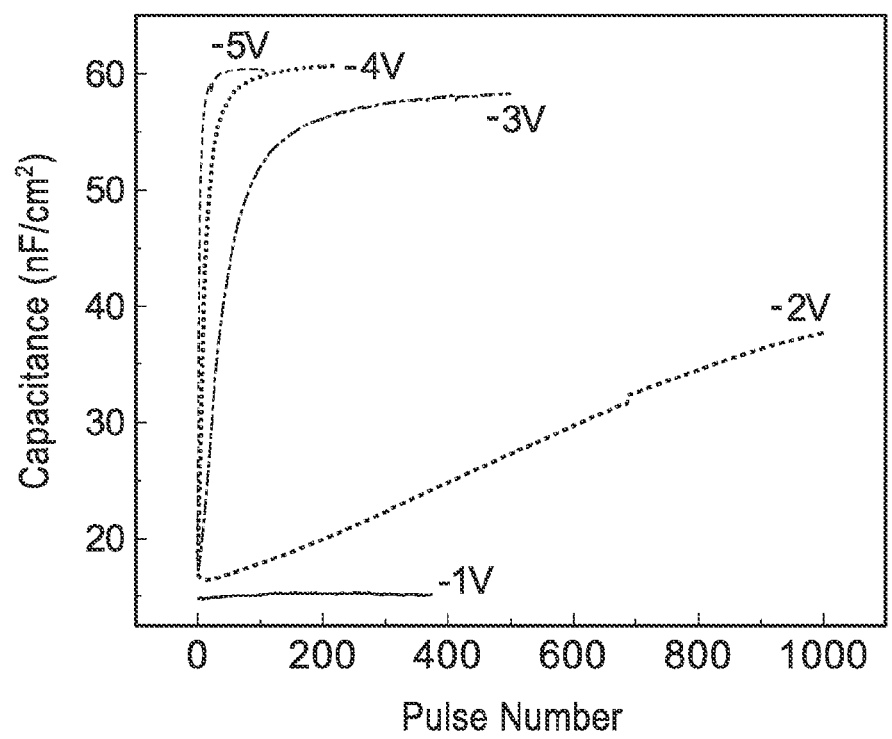
FIG. 6A is a graph of the capacitance of an Al/Ti/RbAg$_4$I$_5$/MEH-PPV/SiO$_2$/p-Si/Al memory capacitor as a function of the number of voltage pulses applied to the device. The pulse amplitudes were fixed at −1 V, −2 V, −3 V, −4 V, and −5 V respectively.
Figure 6B:
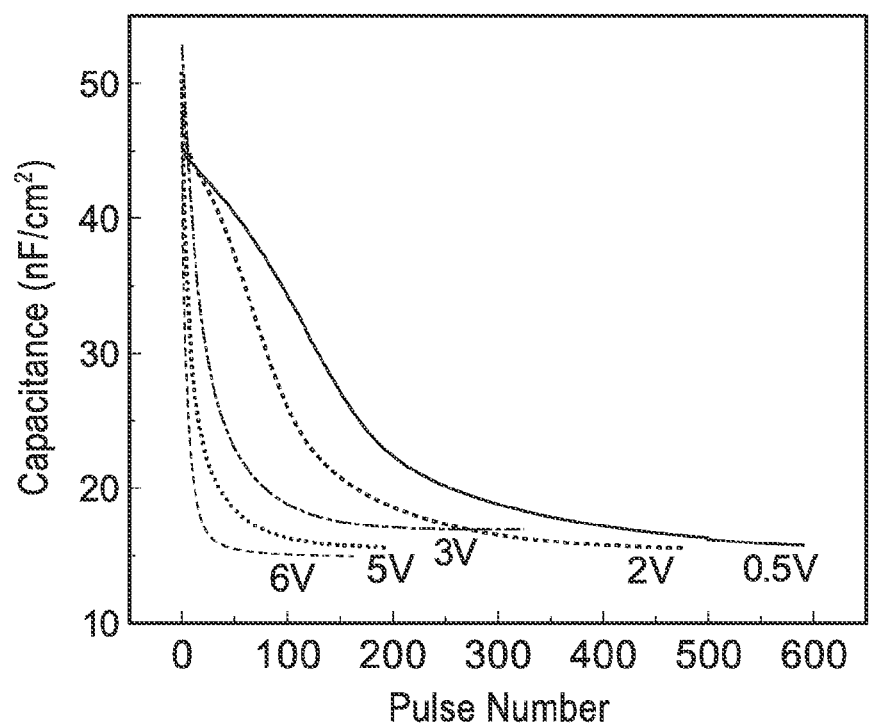
FIG. 6B is a graph of the capacitance of an Al/Ti/RbAg$_4$I$_5$/MEH-PPV/SiO$_2$/p-Si/Al memory capacitor as a function of the number of voltage pulses applied to the device. The pulse amplitudes were fixed at 0.5 V, 2 V, 3 V, 5 V, and 6 V respectively.

As shown in FIG. 6A, the device capacitance was progressively increased by the negative pulses. When the magnitude of the negative configuration pulses was increased from −1 V to −5 V, the rate of capacitance change increased significantly. To observe the reverse configuration, a DC voltage V=−6 V was applied on the device to set its initial capacitance state to a high saturation value (~50 nF/cm$^2$), followed by a series of 100 ms-wide positive pulses with a fixed amplitude. Then the device capacitance was measured after each pulse at zero DC bias. As shown in FIG. 6B, the device capacitance progressively decreased as a result of the positive pulses, and the rate of capacitance change increased with increasing pulse amplitude. The continuous modification of the capacitance by voltage pulses demonstrated that the device capacitance can be effectively configured to analog values.

Figure 6C:
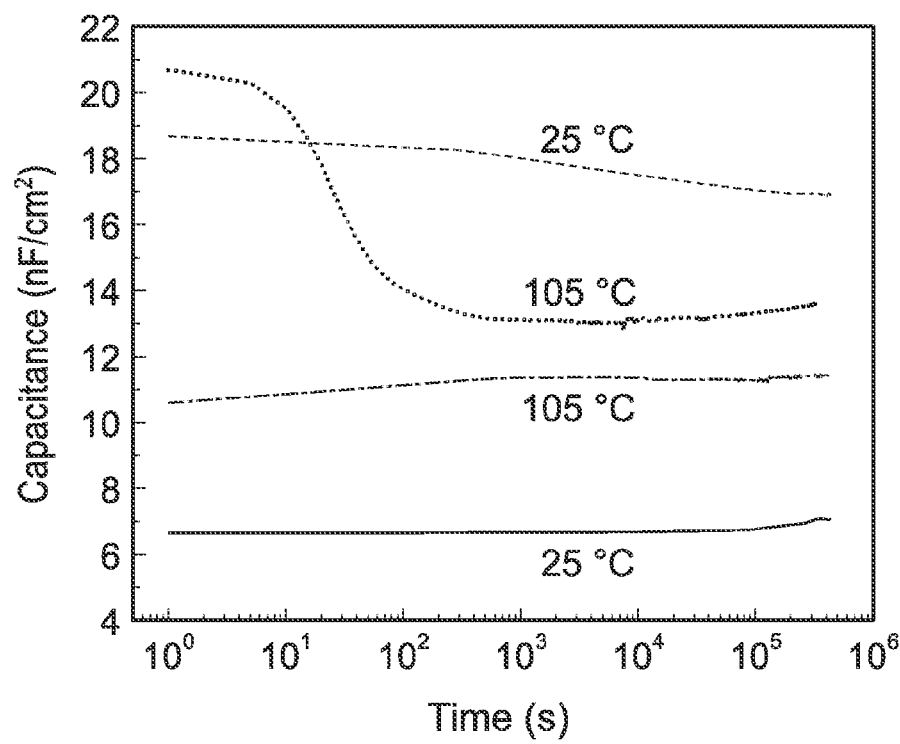
FIG. 6C is a graph of the capacitances of a memory capacitor configured to different values as a function of time in volatility tests at 25° C. and 105° C.
Figure 7:
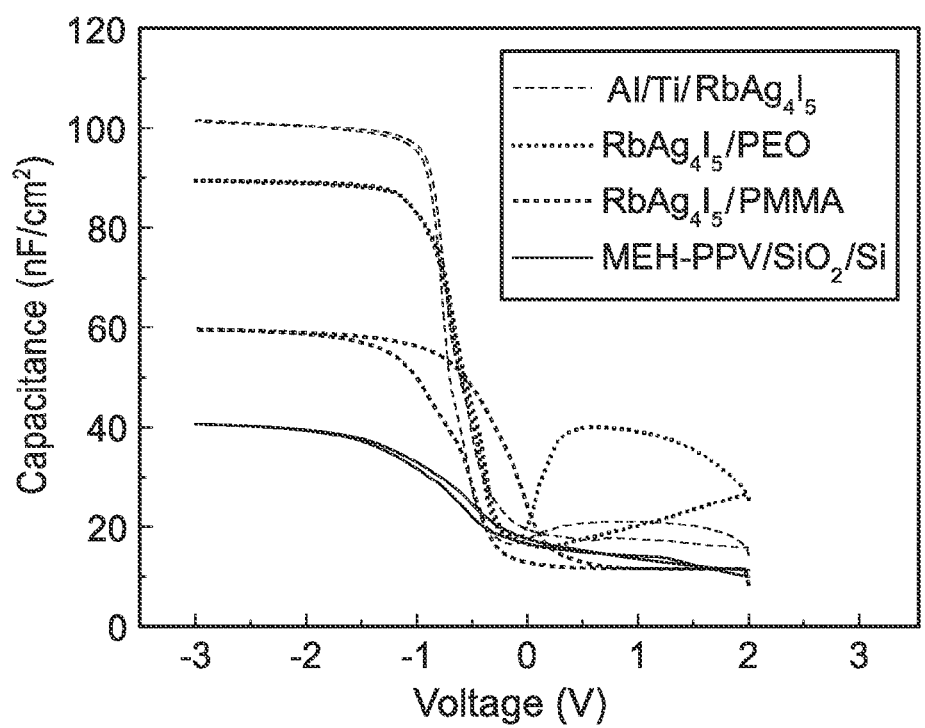
FIG. 7 is a graph of observed device capacitances C as a function of the DC voltage bias V applied to control devices with Al/Ti/RbAg$_4$I$_5$/SiO$_2$/p-Si, Al/Ti/RbAg$_4$I$_5$/PEO/SiO$_2$/p-Si, Al/Ti/RbAg$_4$I$_5$/PMMA/SiO$_2$/p-Si, and Al/Ti/MEH-PPV/SiO$_2$/p-Si structures.

The volatility of the device memory was tested by measuring the change of device capacitance versus time. After a memory capacitor was configured to a low or high capacitance value by applying a voltage bias V=+3 V or −3 V for 30 seconds, its differential capacitance was tested as a function of time for five days at a zero DC bias with a 25 mV AC voltage at a frequency of 1 MHz. The device capacitance decreased when the frequency of the AC test voltage was increased from 10 kHz to 1 MHz. FIG. 6C shows the typical results of a volatility test for the Al/Ti/RbAg$_4$I$_5$/MEH-PPV/SiO$_2$/p-Si/Al memory capacitor measured at 25° C. and 105° C., respectively. The capacitances measured at 25° C. changed by less than 10% over the test period. The capacitance configured to a low value and measured at 105° C. changed by less than 8% over the test period while the capacitance configured to a high value and measured at 105° C. dropped 35% within the first 300 second test period and then changed by less than 2% in the rest of test period.

EXAMPLE 3

In order to understand the switching mechanism of the memory capacitor, C-V measurements were carried out on different control devices under the same experimental conditions described previously in comparison with the Al/Ti/RbAg$_4$I$_5$/MEH-PPV/SiO$_2$/p-Si/Al memory capacitor. By removing the MEH-PPV polymer layer, an Al/Ti/RbAg$_4$I$_5$/SiO$_2$/Si device showed no significant hysteresis loop in the C-V measurement (FIG. 7), indicating that the nonvolatile memory capacitor is associated with the polymer layer. By removing the RbAg$_4$I$_5$ ionic conductor, an Al/Ti/MEH-PPV/SiO$_2$/Si device showed a negligible hysteresis loop in the C-V measurement, indicating that the memory capacitance is related to the ionic exchange between the RbAg$_4$I$_5$ and polymer layers. By substituting the MEH-PPV layer with a poly (methyl methacrylate) (PMMA) layer, a non-conjugated polymer, an Al/Ti/RbAg$_4$I$_5$/PMMA/SiO$_2$/Si device showed a similar hysteresis loop in the C-V curve but a smaller voltage shift in comparison with the memory capacitor. By substituting the MEH-PPV layer with a polyethylene oxide (PEO) layer, a known ion-transport polymer, and an Al/Ti/RbAg$_4$I$_5$/PEO/SiO$_2$/Si device showed no hysteresis loop, but the capacitances of this control device under negative voltage biases are significantly larger than those observed in the memory capacitor.

The volatility of the control devices was also tested under the same experimental conditions described previously in comparison with the Al/Ti/RbAg$_4$I$_5$/MEH-PPV/SiO$_2$/p-Si/Al memory capacitor. The retention times of those control devices were less than ~10$^4$ seconds, which are much shorter than those observed in the memory capacitor.

EXAMPLE 4

The properties of the Al/Ti/RbAg$_4$I$_5$/MEH-PPV/SiO$_2$/p-Si/Al memory capacitor were evaluated and shown to be determined by the modulation of the ionic concentrations in the MEH-PPV polymer layer. The Ag cations have a high concentration and mobility in the RbAg$_4$I$_5$ ionic conductor, which functions as an ionic source. The Ag cations can diffuse from the RbAg$_4$I$_5$ layer to the MEH-PPV layer to reach a quasi-equilibrium profile in the polymer. On the other hand, the I anions have a much larger radius than the Ag cations, can form a large ionic complex I$_3^-$ and/or chemically bond with the MEH-PPV polymer. The I anions have a significantly smaller mobility than the Ag cations in MEH-PPV, and can only drift in MEH-PPV under the influence of an external electrical force exceeding their bonding with the polymer.

X-ray photoelectron spectroscopy (XPS) was used to investigate the concentration of the ions inside the polymer layer in the memory capacitors with the Al/Ti/RbAg$_4$I$_5$/MEH-PPV/SiO$_2$/p-Si/Al structure after the devices experienced various gate biases. In order to improve the relative resolution of the chemical profiles, the thickness of the MEH-PPV polymer layer in the memory capacitor was increased to 200 nm for the XPS experiments, and the voltages applied on the devices were increased accordingly. Voltage biases V=−8 V and +8 V, were applied to the top Al/Ti electrode with respect to the bottom Al electrode of two devices on the same wafer for 1000 seconds. The top metal electrodes were then glued to a glass slide with epoxy, and the Al/Ti/RbAg$_4$I$_5$/MEH-PPV top layers were physically peeled off the SiO$_2$/p-Si substrate. The chemical depth profiles in the detached Al/Ti/RbAg$_4$I$_5$/MEH-PPV top layers were subsequently analyzed by XPS by ion-milling from the exposed MEH-PPV side of the structure.

The specimens were analyzed by XPS using a PHI Quantera Scanning ESCA. The spectrometer used a monochromatic aluminum x-ray source with a photon energy of 1486.7 eV. The analysis was performed using a 200 μm photon beam. The sample was sputtered at a nominal rate of 4.7 nm/min using a 2 kV Ar+ ion beam with azimuthal rotation of the sample. The binding energies were charge corrected to the carbon 1s peak at 284.8 eV. An example XPS survey spectrum was collected from the MEH-PPV polymer surface in the detached Al/Ti/RbAg$_4$I$_5$/MEH-PPV top layers after the memory capacitor experienced a voltage bias −6 V, and graphed as a function of the binding energy. The obtained XPS spectrum indicated the presence of I and Ag ions at the MEH-PPV/SiO$_2$ interface after the application of a negative voltage bias.

The chemical depth profiles of I and Ag ions in the polymer layer of the memory capacitor that experienced various voltage biases were obtained. The XPS results indicate that only I and Ag concentrations in the polymer layers were modified significantly by the voltage biases and there were no perceptible modifications of the other elements that were observed. It was seen that the −8 V bias induced a significant increase in the I concentration in the polymer and the +8 V induced a decrease of I concentration. This indicated that I anions were driven into the polymer by the negative voltage biases from the RbAg$_4$I$_5$ toward the MEH-PPV/SiO$_2$ interface, and remained in the polymer after the voltage biases were removed. Surprisingly, the negative voltage biases also induced an increase of Ag concentration in the polymer. It could be inferred from this observation that after the negative voltage biases were removed, that some Ag cations drifted back into the polymer, attracted by the field induced by the relatively immobile I anions, in order to reduce the net charge in the device.

Accordingly, the X-ray photoelectron spectroscopy (XPS) analysis of the chemical profile of the MEH-PPV layer of a memory capacitor after it experienced various biases demonstrated that when a negative voltage bias above a threshold value was applied to the memory capacitor, the I anions are driven from the RbAg$_4$I$_5$ layer into the polymer layer. The I anions and Ag cations then form ionic dipoles in the polymer, increasing the polymer permittivity and device capacitance. After the negative voltage is removed, some Ag cations drift back into the polymer, attracted by the field induced by the relatively immobile I anions, resulting in the nonvolatile increase of both I and Ag concentrations in the polymer and device capacitance. When a positive voltage bias above a threshold value is applied, the I anions are extracted from the polymer and moved back into the RbAg$_4$I$_5$ layer. After the voltage bias is removed, the decrease of the anionic concentrations in the polymer reduces the ionic dipole concentration, resulting in the nonvolatile decrease of polymer permittivity and device capacitance.

The ionic complex and its bonding with the polymer matrix provide reasonably good nonvolatile memory characteristic for the device. A voltage above a threshold value is needed to overcome the bonding and move the I anions in the polymer, and the threshold voltages (with the opposite polarities) to extract and inject I anions to produce the clockwise hysteresis loop in the C-V curves that are characteristically observed. The injection or extraction rate of the I anions in the polymer increases with the magnitude of the voltage biases applied to the device, and therefore the rate of capacitance change increases with the increasing voltage magnitude.

In the Al/Ti/RbAg$_4$I$_5$/PMMA/SiO$_2$/p-Si/Al device, the concentrations of Ag and I ions in the PMMA polymer can also be modulated by the voltage biases applied. However the I anionic bonding with the non-conjugated PMMA polymer might be weaker than that with the conjugated MEH-PPV polymer, therefore the threshold voltages to move I anions in PMMA are smaller than those in MEH-PPV, and the experimentally observed C-V hysteresis loop in the PMMA-based device is smaller than that in the MEH-PPV-based device. In comparison with MEH-PPV and PMMA, the PEO polymer has the highest ionic mobility and the weakest bonding with ions. Consequently the capacitance of the Al/Ti/RbAg$_4$I$_5$/PEO/SiO$_2$/p-Si/Al device was increased due to the increasing concentration of the ionic dipoles in PEO when the voltage bias applied on the device swept from 2 V to −3 V, but no obvious C-V hysteresis loop was observed. The weak bonding between the ions and the polymer matrixes also leads to the short retention times for the configured capacitances in the control devices.

EXAMPLE 5

The retention characteristics of control devices with the Al/Ti/RbAg$_4$I$_5$/SiO$_2$/p-Si, Al/Ti/RbAg$_4$I$_5$/PEO/SiO$_2$/p-Si,l/Ti/RbAg$_4$I$_5$/PMMA/SiO$_2$/p-Si, and Al/Ti/MEH-PPV/SiO$_2$/p-Si structures were also measured under the same experimental conditions described in the text in comparison with the Al/Ti/RbAg$_4$I$_5$/MEH-PPV/SiO$_2$/p-Si/Al memory capacitor. The devices were configured by applying 3 V or −3 V voltage biases, respectively, for 100 seconds, and then their differential capacitances were tested as a function of time at a temperature of 25° C. and a frequency of 1 MHz with a zero DC bias. After the capacitances of control devices were configured to different values by the voltage biases, the capacitances of the Al/Ti/RbAg$_4$I$_5$/SiO$_2$/p-Si and Al/Ti/RbAg$_4$I$_5$/PEO/SiO$_2$/p-Si devices gradually evolved toward quasi-equilibrium values within ~10$^3$ seconds, and the capacitances of the Al/Ti/RbAg$_4$I$_5$/PMMA/SiO$_2$/p-Si device gradually evolved toward a quasi-equilibrium value within ~10$^4$ seconds. After the configurations, the Al/Ti/MEH-PPV/SiO$_2$/p-Si device quickly evolved toward a quasi-equilibrium value within ~10$^2$ seconds, and the configured capacitances show negligible difference at the beginning of the measurement at the zero DC bias. The retention times of these control devices were significantly shorter than those observed in the memory capacitor.

After a negative voltage bias is applied to the control capacitors with the Al/Ti/RbAg$_4$I$_5$/PMMA/SiO$_2$/p-Si and Al/Ti/RbAg$_4$I$_5$/PEO/SiO$_2$/p-Si structures, the I anions are driven from the RbAg$_4$I$_5$ layer into the polymer layer. After the negative voltage is removed, attracted by the relatively immobile I anions in the polymer, the mobile Ag cations drift into the polymer, and I anions and Ag cations then form ionic dipoles in the polymer, increasing the polymer permittivity and device capacitance. The weak bonding between the ions and the PMMA or PEO polymer matrixes cannot hold the ions in the polymer, therefore the ions gradually approach their quasi-equilibrium profiles, and the device capacitance gradually evolves toward its quasi-equilibrium value. When a positive voltage bias is applied to the control capacitors, the Ag cations are driven from the RbAg$_4$I$_5$ layer into the polymer layer, and the residual I anions in the polymer are driven toward to the RbAg$_4$I$_5$ layer. After the positive voltage is removed, attracted by the field induced by the relatively immobile I anions, the mobile Ag cations drift toward the RbAg$_4$I$_5$ layer, and the ionic dipoles in the polymer and the device capacitance are reduced. When the ions gradually approach their quasi-equilibrium profiles, the device capacitance gradually evolves toward its quasi-equilibrium value.

When a positive or negative voltage bias is applied to the control capacitor with the Al/Ti/RbAg$_4$I$_5$/SiO$_2$/p-Si structure, the mobile Ag anions are driven by the electrical field, and accumulated near the RbAg$_4$I$_5$/SiO$_2$ or Al/Ti/RbAg$_4$I$_5$ interfaces. The separated ionic charges generate ionic dipoles in the RbAg$_4$I$_5$ layer, increasing the device capacitance. After the voltage bias is removed, attracted by the relatively immobile I anions in the RbAg$_4$I$_5$ layer, the mobile Ag cations recombine with the I anions in the RbAg$_4$I$_5$ layer, and the ionic dipoles in the device and the device capacitance are gradually decreased toward their quasi-equilibrium values. When a positive or negative voltage bias is applied to the control capacitor with the Al/Ti/MEH-PPV/SiO$_2$/p-Si structure, the capacitor is charged by electrons and holes like the conventional capacitors, no significant ionic charges are involved in the charge process. After the voltage bias is removed, the electrons and holes are discharged quickly at a speed much higher than the ions.

In summary, a nonvolatile analog memory capacitor based on an ion-doped MEH-PPV polymer was demonstrated. The dielectric property of the polymer can be configured by applying an electric field to modulate Ag and I ionic concentrations in the polymer. The device capacitance can be continuously modified to analog values dynamically and reversibly by applying voltage pulses with an amplitude V<−1 V or V>0.4 V, and the configuration rate can be tuned by adjusting the amplitude and duration of the voltage pulses. After the device capacitance was configured to a specific value, it changed by less than 10% under continual reading conditions for five days. The nonvolatile analog memory capacitor may be used to produce new dynamic analog or neuromorphic circuits.

From the discussion above it will be appreciated that the invention can be embodied in various ways, including the following:

1. A memory capacitor device comprising a first electrode; a second electrode; and a field configurable ion-doped material between the electrodes; wherein the device has a nonvolatile capacitance that is modifiable to arbitrary analog values as a function of voltage bias applied to the first and second electrodes.

2. A memory capacitor device according to embodiment 1, wherein the first and second electrodes comprise a metal selected from the group consisting of conductive metals and semiconductors.

3. A memory capacitor device according to embodiment 1, wherein the ion-doped material is selected from the group of materials consisting of polymers, conjugated polymers, ion-conductive polymers, MEH-PPV, nafion, PSS-PEDOT, solid state ion-doped materials, electrolyte, RbAg$_4$I$_5$, ZrO$_2$, lanthanum fluoride, silver sulfide, and perovskite ceramics.

4. A memory capacitor according to embodiment 1, further comprising an insulating layer adjacent at least one of the electrodes.

5. A memory capacitor according to embodiment 4, wherein the insulating layer comprises SiO$_2$ or Si$_3$N$_4$.

6. A memory capacitor device according to embodiment 1, wherein when a voltage bias is applied between the first and second electrodes, ions can be injected into or extracted out from the material to modify concentration of ionic dipoles in the material, resulting in modification of capacitance of the device.

7. A memory capacitor device according to embodiment 1, wherein device capacitance is modifiable to arbitrary analog values dynamically and reversibly by applying voltage pulses of different amplitude and polarity across the first and second electrodes.

8. A memory capacitor device according to embodiment 1, wherein when a voltage bias is applied between the first and second electrodes, ions can be injected into the material or extracted out of the material; wherein injection or extraction of ions results in modification of concentration of ionic dipoles in the material; and wherein modification of concentration of ionic dipoles in the material causes modification of capacitance of the device.

9. A memory capacitor device according to embodiment 1, wherein an electric charge Q passing through the device is a function of a voltage V applied to the device; wherein capacitance and a configurable parameter ρ can be modified and memorized to arbitrary analog values by the voltage V as a function of time t; and wherein the configurable parameter ρ denotes state of the device.

10. A memory capacitor device according to embodiment 9, wherein $$C_m(\rho, V, t) = \frac{dQ}{dV} = \frac{I}{dV/dt} \text{ and } \frac{d\rho}{dt} = f(\rho, V, t)$$

where I=current passing through the device.

11. A memory capacitor device according to embodiment 9, wherein when $$\frac{d\rho}{dt} = 0,$$

capacitance of the device is a constant and the device is reduced to a conventional capacitor.

12. A memory capacitor device according to embodiment 1, wherein the first electrode, the second electrode, and the field configurable ion-doped material between the electrodes comprise layers in multilayer structure; the multilayer structure comprising an Al/Ti/RbAg$_4$I$_5$/MEH-PPV/SiO$_2$/p-Si/Al multilayer structure having an SiO$_2$ insulating layer on a p-type Si substrate contacted with an Al bottom electrode, a conjugated polymer layer of poly[2-methoxy-5-(2'-ethylhexyloxy)-p-phenylene vinylene] (MEH-PPV), and a RbAg$_4$I$_5$ ionic conductive layer were sandwiched between the SiO$_2$ layer and an Al/Ti top metal electrode.

13. A memory capacitor device according to embodiment 1, wherein the first electrode, the second electrode, and the field configurable ion-doped material between the electrodes comprise layers in multilayer structure comprising an Al bottom electrode; a p-type Si layer over the Al bottom electrode; a conjugated polymer layer of poly[2-methoxy-5-(2'-ethylhexyloxy)-p-phenylene vinylene] (MEH-PPV) over the p-type Si layer; an RbAg$_4$I$_5$ ionic conductive layer over the MEH-PPV layer; and an AL/Ti top electrode over the ionic conductive layer.

14. A memory capacitor device, comprising: an Al/Ti/RbAg$_4$I$_5$/MEH-PPV/SiO$_2$/p-Si/Al multilayer structure having an SiO$_2$ insulating layer on a p-type Si substrate contacted with an Al bottom electrode, a conjugated polymer layer of poly[2-methoxy-5-(2'-ethylhexyloxy)-p-phenylene vinylene] (MEH-PPV), and a RbAg$_4$I$_5$ ionic conductive layer between the SiO$_2$ layer and an Al/Ti top metal electrode.

15. A memory capacitor device according to embodiment 14, wherein when a voltage bias is applied to the top and bottom electrodes, ions can be injected into or extracted out from the polymer layer to modify concentration of ionic dipoles in the polymer layer, resulting in modification of capacitance of the device.

16. A memory capacitor device as recited in claim 14, wherein device capacitance is modifiable to arbitrary analog values dynamically and reversibly by applying voltage pulses of different amplitude and polarity between the top and bottom electrodes.

17. A memory capacitor device as recited in claim 14, wherein when a voltage bias is applied between the top and bottom electrodes, ions can be injected into the polymer layer or extracted out of the polymer layer; wherein injection or extraction of ions results in modification of concentration of ionic dipoles in the polymer layer; and wherein modification of concentration of ionic dipoles in the polymer layer causes modification of capacitance of the device.

18. A memory capacitor device, comprising: an Al bottom electrode; a p-type Si layer over the Al bottom electrode; a conjugated polymer layer of poly[2-methoxy-5-(2'-ethylhexyloxy)-p-phenylene vinylene] (MEH-PPV) over the p-type Si layer; an RbAg$_4$I$_5$ ionic conductive layer over the MEH-PPV layer; and an AL/Ti top electrode over the ionic conductive layer.

19. A memory capacitor device according to embodiment 18, wherein when a voltage bias is applied to the top and bottom electrodes, ions can be injected into or extracted out from the polymer layer to modify concentration of ionic dipoles in the polymer layer, resulting in modification of capacitance of the device.

20. A memory capacitor device according to embodiment 18, wherein device capacitance is modifiable to arbitrary analog values dynamically and reversibly by applying voltage pulses of different amplitude and polarity to the top and bottom electrodes.

21. A memory capacitor device as recited in claim 18, wherein when a voltage bias is applied between the top and bottom electrodes, ions can be injected into the polymer layer or extracted out of the polymer layer; wherein injection or extraction of ions results in modification of concentration of ionic dipoles in the polymer layer; and wherein modification of concentration of ionic dipoles in the polymer layer causes modification of capacitance of the device.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A memory capacitor device, comprising:
   an Al bottom electode;
   a Al/Ti top electrode; and
   a field configurable ion-doped material between said electrodes;
   wherein the device has a nonvolatile capacitance that is modifiable to arbitrary analog values as a function of voltage bias applied to the top and bottom electrodes;
   wherein said first electrode, said second electrode, and said field configurable ion-doped material between said electrodes comprise layers in a multilayer structure;
   said multilayer structure comprising:
      the Al bottom electrode;
      a p-type Si layer over the Al bottom electrode;
      a SiO$_2$ insulating layer over the p-type Si layer;
      a conjugated polymer layer of poly[2-methoxy-5-(2'-ethylhexyloxy)-p-phenylene vinylene] (MEH-PPV) over the SiO$_2$ insulating layer;
      a RbAg$_4$I$_5$ ionic conductive layer over the MEH-PPV layer; and
      the AL/Ti top electrode over the ionic conductive layer.

2. A memory capacitor device as recited in claim 1, wherein device capacitance is modifiable to said arbitrary analog values dynamically and reversibly by applying voltage pulses of different amplitude and polarity between the top and bottom electrodes.

3. A memory capacitor device as recited in claim 1:
   wherein when the voltage bias is applied between the top and bottom electrodes ions can be injected into the material or extracted out of the material;
   wherein injection or extraction of ions results in modification of concentration of ionic dipoles in the material; and
   wherein modification of concentration of ionic dipoles in the material causes modification of capacitance of the device.

4. A memory capacitor device as recited in claim 1:
   wherein an electric charge Q passing through the device is a function of a voltage V applied to the device;
   wherein capacitance and a configurable parameter p can be modified and memorized to arbitrary analog values by the voltage V as a function of time t ; and
   wherein the configurable parameter p denotes state of the device; and
   wherein when dp/dt=0 capacitance of the device is a constant and the device is reduced to a conventional capacitor.

5. A memory capacitor device, comprising:
   a multilayer structure;
   the multilayer structure having:
      an Al bottom electrode;
      a p-type Si layer over the Al bottom electrode;
      a Si$_3$N$_4$ insulating layer over the p-type Si layer;
      a conjugated polymer layer of poly[2-methoxy-5-(2'-ethylhexyloxy)-p-phenylene vinylene] (MEH-PPV) over the Si$_3$N$_4$ insulating layer;

a RbAg$_4$I$_5$ ionic conductive layer over the MEH-PPV layer; and an AL/Ti top electrode over the ionic conductive layer.

6. A memory capacitor device as recited in claim 5, wherein device capacitance is modifiable to said arbitrary analog values dynamically and reversibly by applying voltage pulses of different amplitude and polarity to the top and bottom electrodes.

7. A memory capacitor device as recited in claim 5:

wherein when a voltage bias is applied between the top and bottom electrodes, ions can be injected into the polymer layer or extracted out of the polymer layer;

wherein injection or extraction of ions results in modification of concentration of ionic dipoles in the polymer layer; and wherein modification of concentration of ionic dipoles in the polymer layer causes modification of capacitance of the device.

8. A memory capacitor device, comprising:

an Al bottom electrode;

a p-type Si layer over the Al bottom electrode;

a conjugated polymer layer of poly[2-methoxy-5-(2'-ethylhexyloxy)-p-phenylene vinylene] (MEH-PPV) over the p-type Si layer;

a RbAg$_4$I$_5$ ionic conductive layer over the MEH-PPV layer; and an AL/Ti top electrode over the ionic conductive layer.

9. A memory capacitor device as recited in claim 8, wherein device capacitance is modifiable to said arbitrary analog values dynamically and reversibly by applying voltage pulses of different amplitude and polarity to the top and bottom electrodes.

10. A memory capacitor device as recited in claim 8:

wherein when a voltage bias is applied to the top and bottom electrodes, ions can be injected into the polymer layer or extracted out of the polymer layer;

wherein injection or extraction of ions results in modification of concentration of ionic dipoles in the polymer layer; and wherein modification of concentration of ionic dipoles in the polymer layer causes modification of capacitance of the device.

11. A memory capacitor device, comprising:

a first electrode;

a second electrode; and a field configurable ion-doped material between said electrodes;

wherein said device has a nonvolatile capacitance that is modifiable to arbitrary analog values as a function of voltage bias applied to the first and second electrodes; and wherein said first electrode, said second electrode, and said field configurable ion-doped material between said electrodes comprise layers in multilayer structure;

said multilayer structure comprising:

an Al bottom electrode;

a p-type Si layer over the Al bottom electrode;

a conjugated polymer layer of poly[2-methoxy-5-(2'-ethylhexyloxy)-p-phenylene vinylene] (MEH-PPV) over the p-type Si layer;

a RbAg$_4$I$_5$ ionic conductive layer over the MEH-PPV layer; and an AL/Ti top electrode over the ionic conductive layer.

* * * * *